(12) United States Patent
Khan et al.

(10) Patent No.: US 9,129,980 B2
(45) Date of Patent: Sep. 8, 2015

(54) PACKAGE 3D INTERCONNECTION AND METHOD OF MAKING SAME

(71) Applicant: Broadcom Corporation, Irvine, CA (US)

(72) Inventors: Rezaur Rahman Khan, Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/929,240

(22) Filed: Jun. 27, 2013

(65) Prior Publication Data

US 2013/0295723 A1    Nov. 7, 2013

Related U.S. Application Data

(62) Division of application No. 13/174,066, filed on Jun. 30, 2011, now Pat. No. 8,508,045.

(60) Provisional application No. 61/448,880, filed on Mar. 3, 2011.

(51) Int. Cl.
*H01L 21/44* (2006.01)
*H01L 21/56* (2006.01)
(Continued)

(52) U.S. Cl.
CPC .......... *H01L 21/565* (2013.01); *H01L 23/5385* (2013.01); *H01L 23/552* (2013.01); *H01L 25/105* (2013.01); *H01L 23/3128* (2013.01); *H01L 23/49811* (2013.01); *H01L 23/49816* (2013.01); *H01L 23/49827* (2013.01); *H01L 23/5389* (2013.01); *H01L 24/16* (2013.01); *H01L 2224/16225* (2013.01); *H01L 2224/16227* (2013.01); *H01L 2224/32225* (2013.01); (Continued)

(58) Field of Classification Search
USPC ....................................................... 438/126
See application file for complete search history.

(56) References Cited

U.S. PATENT DOCUMENTS 6,346,434 B1   2/2002   Andoh
7,432,586 B2   10/2008  Zhao et al.
(Continued)

FOREIGN PATENT DOCUMENTS

WO    WO 2006/028090    3/2006

OTHER PUBLICATIONS

Dreiza et al., "Implement stacked package-on-package designs", Amkor Technology Inc., retrieved from the internet on Oct. 17, 2005 http://www.eetasia.com/ARTICLES/2005OCT/B/2005OCT17_EDA_MFG_TA.pdf., pp. 1-3.
(Continued)

*Primary Examiner* — Chandra Chaudhari
(74) *Attorney, Agent, or Firm* — Sterne, Kessler, Goldstein & Fox PLLC

(57) ABSTRACT

A method of manufacturing an integrated circuit (IC) package is provided. The method includes mounting a fast plurality of contact members on a surface of a package member, and coupling a second plurality of contact members located on a first surface of an interposer substrate to corresponding ones of the first plurality of contact members. The interposer substrate is configured such that a circuit member mounted to a second surface of the interposer substrate is electrically coupled to the first plurality of contact members.

20 Claims, 16 Drawing Sheets

(51) Int. Cl.
*H01L 23/552* (2006.01)
*H01L 25/10* (2006.01)
*H01L 23/538* (2006.01)
H01L 23/31 (2006.01)
H01L 23/498 (2006.01)
H01L 23/00 (2006.01)

(52) U.S. Cl.
CPC ......... *H01L2224/48227* (2013.01); *H01L 2224/73265* (2013.01); *H01L 2225/1005* (2013.01); *H01L 2225/1023* (2013.01); *H01L 2225/1041* (2013.01); *H01L 2225/1058* (2013.01); *H01L 2924/15311* (2013.01); *H01L 2924/15331* (2013.01); *H01L 2924/3011* (2013.01); *H01L 2924/3025* (2013.01); *H01L 2924/3511* (2013.01)

(56) References Cited

U.S. PATENT DOCUMENTS

| | | | |
|---|---|---|---|
| 7,482,690 | B1 | 1/2009 | Fan et al. |
| 7,518,224 | B2 * | 4/2009 | Shim et al. .......... 257/686 |
| 7,535,086 | B2 * | 5/2009 | Merilo et al. .......... 438/109 |
| 7,714,453 | B2 | 5/2010 | Khan et al. |
| 8,049,119 | B2 | 11/2011 | Beddingfield et al. |
| 8,354,301 | B2 | 1/2013 | Roberts et al. |
| 2004/0173891 | A1 | 9/2004 | Imai et al. |
| 2004/0178499 | A1 | 9/2004 | Mistry et al. |
| 2005/0184377 | A1 | 8/2005 | Takeuchi et al. |
| 2005/0205982 | A1 | 9/2005 | Kawano |
| 2006/0043559 | A1 | 3/2006 | Chow et al. |
| 2006/0110849 | A1 | 5/2006 | Lee et al. |
| 2006/0192277 | A1 | 8/2006 | RaghuRam |
| 2006/0214278 | A1 | 9/2006 | Martin |
| 2007/0063332 | A1 | 3/2007 | Go et al. |
| 2007/0075415 | A1 | 4/2007 | Osumi |
| 2007/0152328 | A1 | 7/2007 | Jadhav et al. |
| 2007/0158813 | A1 | 7/2007 | Kim |
| 2007/0254404 | A1 | 11/2007 | Gerber et al. |
| 2007/0290376 | A1 | 12/2007 | Zhao et al. |
| 2008/0211089 | A1 | 9/2008 | Khan et al. |
| 2009/0166835 | A1 * | 7/2009 | Yang et al. .......... 438/109 |
| 2011/0260313 | A1 | 10/2011 | Vim et al. |
| 2011/0318878 | A1 | 12/2011 | Tanaka |
| 2012/0187578 | A1 | 7/2012 | Li |
| 2012/0223429 | A1 | 9/2012 | Khan et al. |
| 2012/0225522 | A1 | 9/2012 | Zhao et al. |
| 2012/0241977 | A1 | 9/2012 | Gluschenkov et al. |
| 2012/0306078 | A1 | 12/2012 | Pagaila et al. |
| 2012/0319266 | A1 | 12/2012 | Park et al. |
| 2012/0326290 | A1 | 12/2012 | Andry et al. |
| 2013/0026609 | A1 | 1/2013 | Wu et al. |
| 2013/0059417 | A1 | 3/2013 | Kikuchi et al. |
| 2013/0075898 | A1 | 3/2013 | Pratt |
| 2013/0078764 | A1 | 3/2013 | Yamazaki et al. |
| 2013/0099377 | A1 | 4/2013 | Yu et al. |
| 2013/0099390 | A1 | 4/2013 | Kurita et al. |
| 2013/0109135 | A1 | 5/2013 | Lee et al. |
| 2013/0200515 | A1 | 8/2013 | Hwang et al. |
| 2013/0234328 | A1 | 9/2013 | Lee |
| 2013/0234342 | A1 | 9/2013 | Shibata et al. |

OTHER PUBLICATIONS

Freyman et al., "Overmolded Plastic Pad Array Carriers (OMPAC): A low Cost, High Interconnect Density IC Packaging Solution for Consumer and Industrial Electronics", Electronic Components and Technology Conference, IEEE, 1991, pp. 176-182.

\* cited by examiner

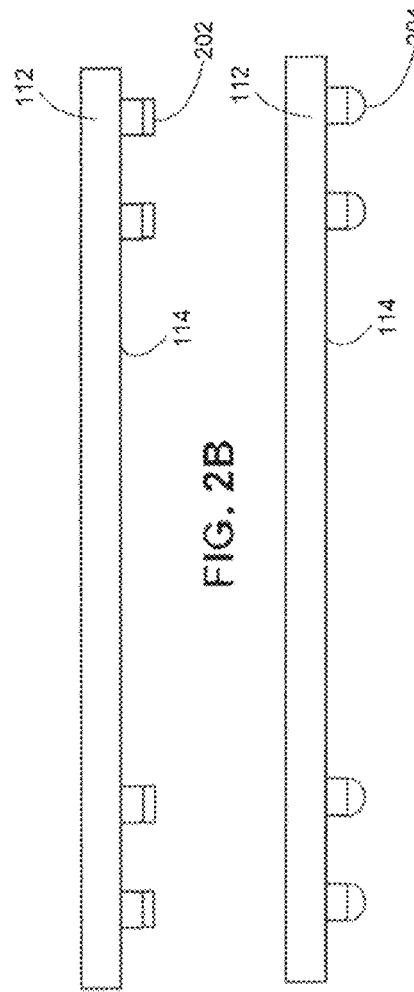

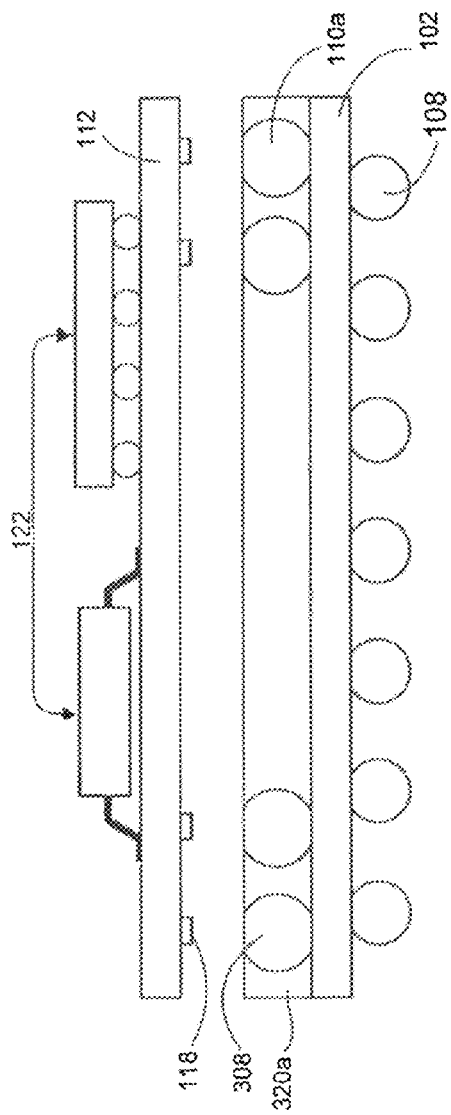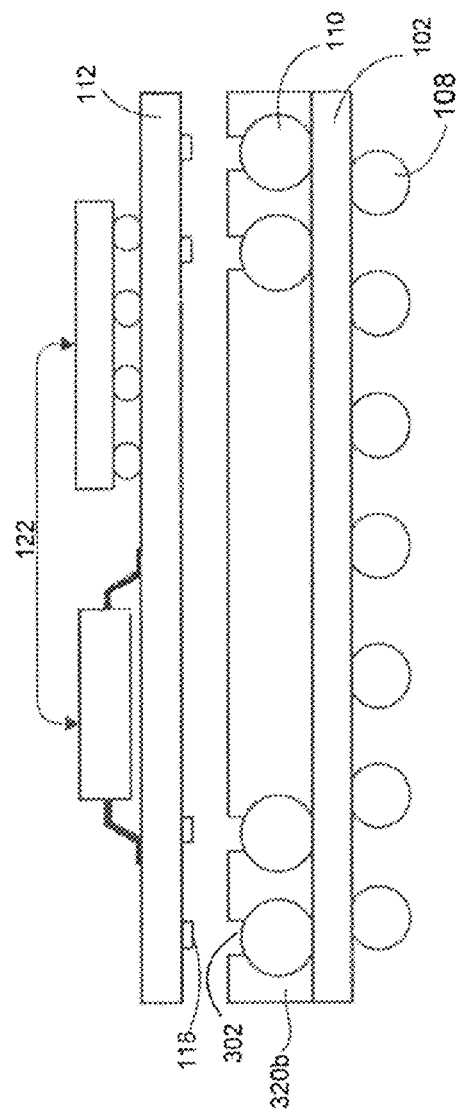
FIG. 3A
FIG. 3B

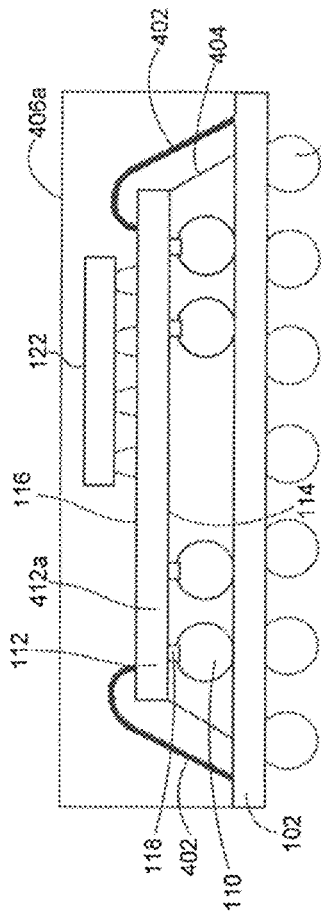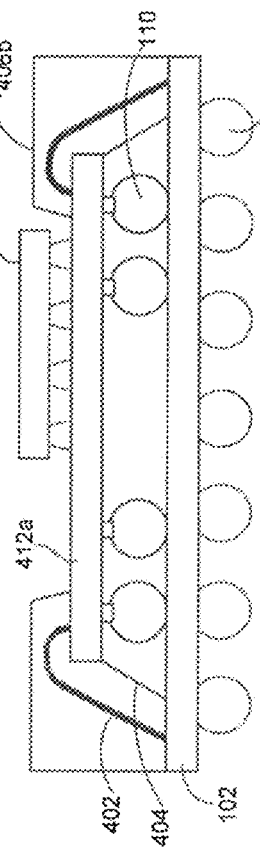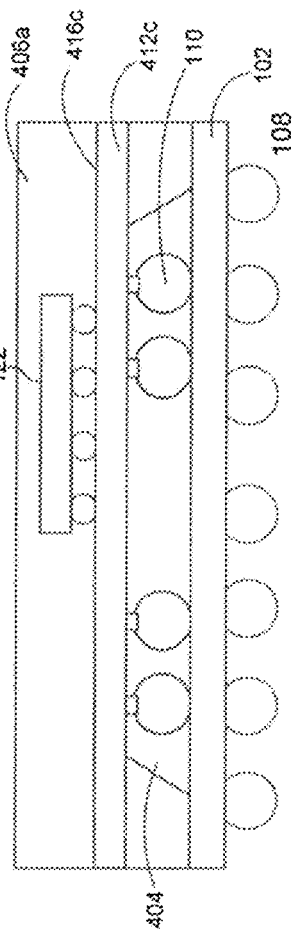

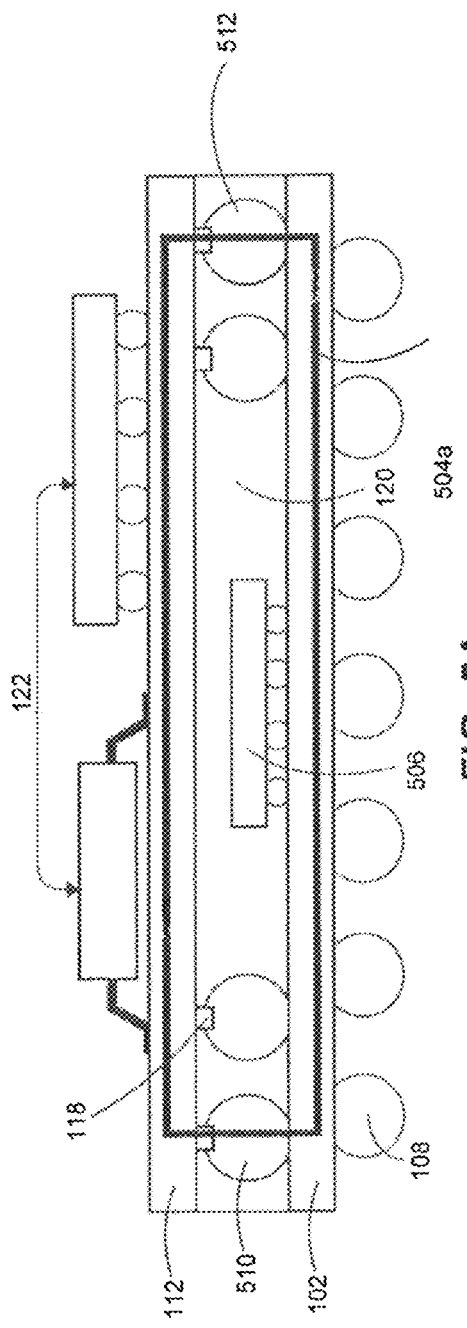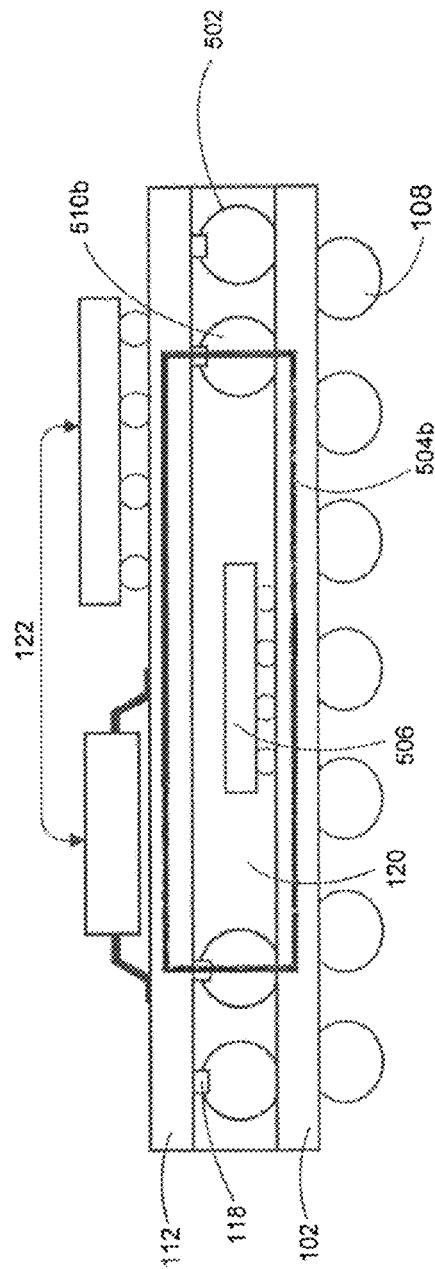

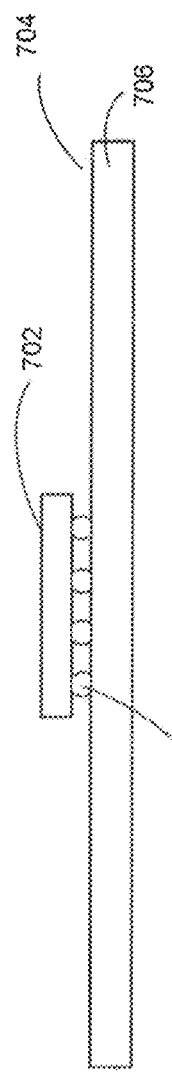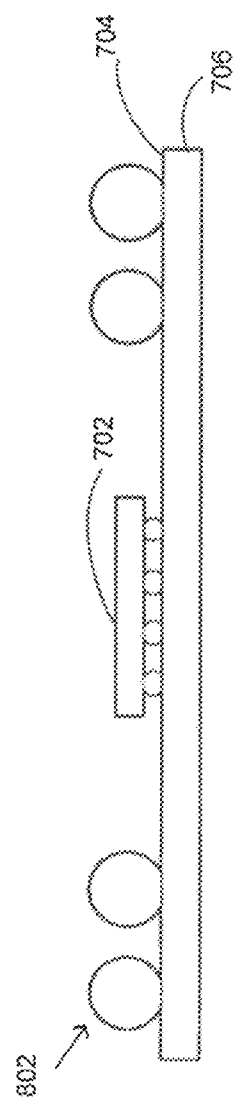

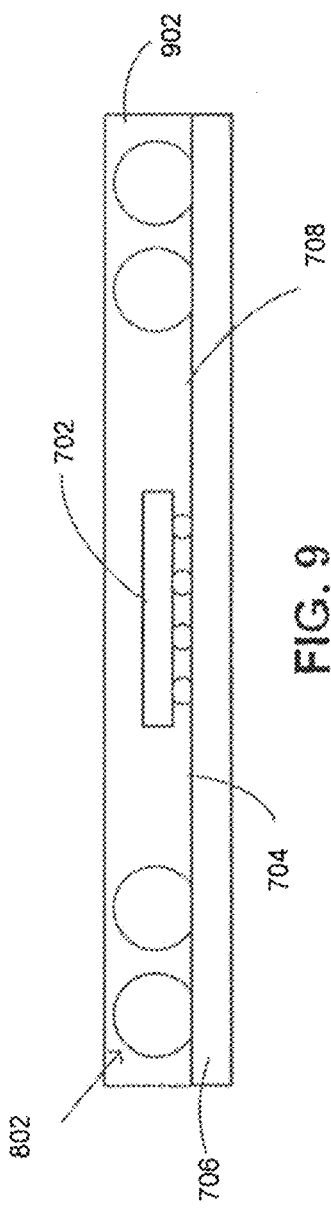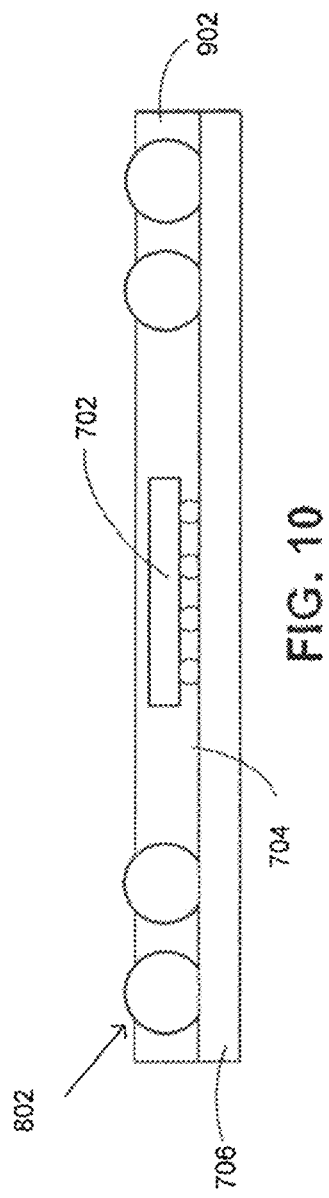

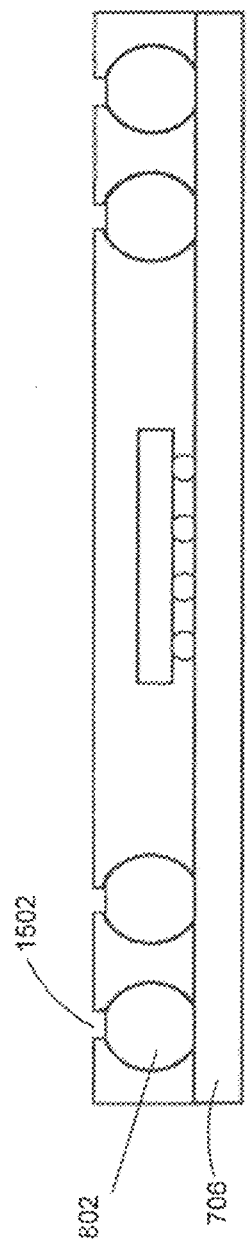

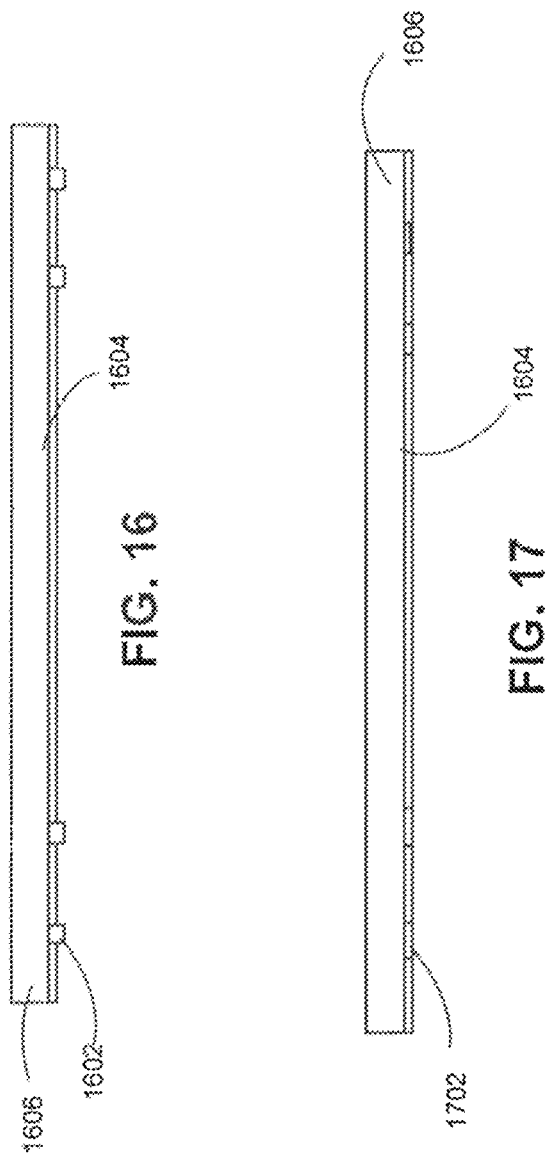

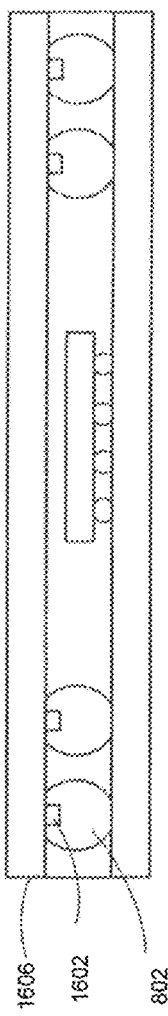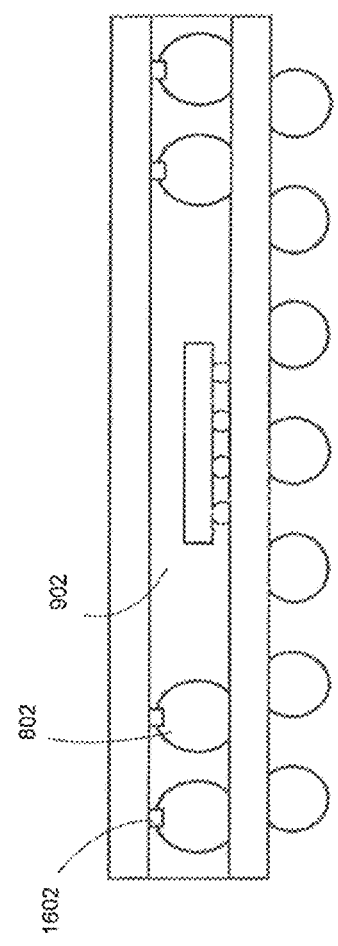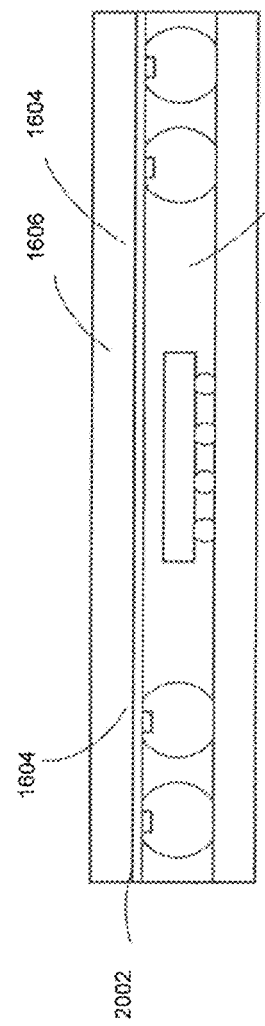

PACKAGE 3D INTERCONNECTION AND METHOD OF MAKING SAME

CROSS REFERENCE TO RELATED APPLICATIONS

This application is a divisional of U.S. patent application Ser. No. 13/174,066, filed Jun. 30, 2011 (now allowed), which claims the benefit of U.S. Provisional Appl. No. 61/448,880, filed Mar. 3, 2011, all of which are incorporated by reference herein in their entireties.

BACKGROUND

1. Field

Embodiments described herein generally related to integrated circuit (IC) device packaging technology.

2. Background

Die-up plastic ball grid array packages were first introduced by Motorola and were called Overmolded Plastic Pad Array Carriers (OMPAC) (See, B. Freyman, and R. Pennisi, "Overmolded Plastic Pad Array Carriers (OMPAC): A Low Cost, High Interconnect Density IC Packaging Solution for Consumer and Industrial Electronics", Electronic Components and Technology Conference, IEEE, pp. 176-182, 1991). Commonly known as a PBGA package, the plastic ball grid array package features a plastic printed circuit board (substrate) typically made of BT (Bismaleimide Triazine) resins or FR4 materials.

Conventional PBGA packages have the drawbacks of (1) poor thermal performance, (2) no EMI protections, (3) thick top mold and overall package profile height, (4) small ratio of die-to-package size since the mold cap must be clamped to the package substrate for molding, and (5) large package body size. Both the resin substrate and the plastic molding compound materials have low thermal conductivity values molding compound). Since the die is surrounded entirely by materials with poor heat conduction properties, the heat generated on the IC die is trapped within the PBGA package. The temperature of the IC die has to rise to very high values above the environment temperature in order to release the trapped heat to the environment.

Both the resin substrate and the plastic molding compound materials are transparent to electromagnetic radiation. Consequently, electromagnetic radiation generated from the IC device will escape from the package and enter the electronic system and interfere with other electronic components. The IC device is also unprotected from electromagnetic radiation emitted from other components inside as well as outside the electronic system.

The mold thickness of the joint Electron Device Engineering Council (JEDEC) standard PBGA packages is 1.17 mm. At a mold thickness of 1.17 mm, the overall heights of PBGA packages commonly are in the range of 1.5 mm~2.5 mm. For mobile applications such as hand-held communication devices (cell phones, global positioning devices, watch-size communication devices, etc.), mobile multimedia (video/audio) players, wireless personal area networking devices such as Bluetooth headset, and flash memory devices such as memory cards, paper-thin packages are desirable to enable small electronic devices for these applications.

A mold chase with multi-cavity mold caps is used for mold encapsulation of JEDEC standard PBGA packages. Each individual substrate unit in a substrate strip or panel has a corresponding mold cap for molding using thermoset molding epoxy. This is necessary in order to clamp the mold chase to the package substrate peripheral in a transfer molding process. The periphery of the substrate top surface is exposed (not covered by the molding compound). Both the IC die and wirebond interconnections from the die edge to the package substrate must be placed within the mold cavity. Additionally, the IC die and the wirebond must be kept at a sufficient distance away from the inner walls of the mold cavity to allow mold flow and avoid wire sweeping. Consequently, the size of the IC die is confined by the size of the mold cap (mold cavity). For a given size of substrate, the allowed maximum size of the die is substantially smaller than the size of the substrate.

Conventional PBGA packages are typically large in body size, ranging from 19 mm×19 mm and above. A large package size is undesirable for mobile applications where bulky electronic components make for bulky devices. To reduce package size, chip scale packages have been developed where the size of the IC die is very close to the size of the package. In addition to the smaller solder balls and smaller ball pitch used for a fine pitch ball grid array (FBGA) package, the mold thickness is reduced to 0.25 mm~0.7 mm. The molding compound covers the entire top surface of FBGA package that enables the increase of die size to substrate size ratio.

Dreiza et al. reported stacked packages using wirebonded bottom PSvfBGA (package stackable very thin fine pitch BGA) (M. Dreiza, A, Yoshida, J. Micksch, and L. Smith, Implement Stacked Package-on-Package Designs, http://www.eetasia.com/ART_8800379158_480100_TA_db7b00bf.HTM). The package-to-package interconnection is facilitated by mounting the top ball grid array (BGA) package to the substrate of the bottom package. The bottom package has exposed land pads on the substrate top surface which provide contact with the solder balls on the top BGA package. The exposed solder ball land pads are located along the periphery of the substrate top and surround the package molding compound. The top package can be attached to the bottom package using conventional reflow surface mount processes. The PSvfBGA provides the added advantage of reducing overall package stack height by placing the IC die of the bottom package within a window opening in the substrate center.

Because the solder ball land pads on the bottom package substrate top must be exposed for stacking the top package, the IC die of the bottom package must be encapsulated with a mold cavity (mold cap) to define the extent of the mold and prevent the mold compound from covering or contaminating the ball pads. Consequently, the die size in the bottom package can not be too large in order for both the die and bond wires to fit into the mold.

Improvements in EMI shielding have been made for BGA type of IC packages. U.S. Pat. No. 7,432,586, issued Oct. 7, 2008, and commonly owned with the present disclosure, proposes a metal shield integrated into a die-up wire bond ball grid array (BGA) package for both EMI isolation and thermal improvement. The disclosure of the '586 patent is incorporated herein by reference in its entirety as though set forth in full below. In the design disclosed in the '586 patent, an IC die is enclosed inside a top metal structure and a bottom metal structure. The top metal structure is shaped like an inverted cup. The top metal structure is in contact with a flat metal structure at the bottom portion of the mold body. An IC die is mounted on the flat bottom metal structure. Ambient EMI radiations are blocked by the grounded top and metal structures from interfering with the operation of the IC die. This design provides an enclosed metal box, a Faraday cage, for EMI shielding within a wire bond BGA package. For a flip chip die, however, the metal box structure disclosed in the '586 patent cannot provide an interconnection between the IC die and the substrate.

Ideally in package-on-package devices, both the bottom and top packages in the package stack are the same size and type of packages with exactly the same structure (same size of die, same substrate or die carrier design and structure, etc.) in order to minimize stress match between packages. However, interconnections between stacked wirebond packages are most easily made between the package substrates. To provide a vertical package interconnection, the bottom package substrate is partially exposed along the substrate periphery. A transfer mold process with a mold cap cavity smaller than the substrate size must be used. This requirement to partially expose the substrate top surface for package-to-package interconnection purposes limits the bottom package to a PBGA package, or package with similar features. In order to minimize stress mismatch, the top package is also limited to a transfer molded BGA package such as a PBGA package. For an overmold package such as a fine pitch ball grid array (FBGA), it can only be used for the top package because the FBGA substrate top is entirely covered by the mold compound.

Moreover, stacking of FBGA packages can be desirable to reduce the overall footprint size of stacked packages and to reduce overall stacking height (or increase the number of packages in a package stack for as given height) by taking advantage of chip scale design feature and thin mold chase of the FBGA package.

BRIEF DESCRIPTION OF THE DRAWINGS/FIGURES

The accompanying, drawings, which are incorporated herein and form a part of the specification, illustrate the present disclosure and, together with the description, further serve to explain the principles of the disclosure and to enable a person skilled in the pertinent art to make and use the disclosure.

FIGS. 2A-2D illustrates views of various embodiments of an interposer substrate.

FIG. 3A illustrates a view of a further embodiment of a vertical/3-dimensional package interconnection with an interposer substrate having a truncated mold top.

FIG. 3B illustrates a view of a further embodiment of a vertical/3-dimensional package interconnection with an interposer substrate having drilled mold top contact pads.

FIG. 4A illustrates a view of an embodiment of a System in Package (SiP) having a molded interposer substrate.

FIG. 4B illustrates a view of an embodiment of a SiP having a partially exposed interposer substrate.

FIG. 4C illustrates a view of an embodiment of a SiP having an interposer substrate which is substantially the same size as the bottom package.

FIG. 5A illustrates a view of an embodiment having EMI shield and system partitioning with a ground/power bus along an outer row of a molded BGA for EMI shield and system partitioning.

FIG. 5B illustrates a view of an embodiment having EMI shield and system partitioning with a ground/power bus along an inner row of a molded BGA for EMI shield and system partitioning.

FIG. 7 illustrates a view of an IC die attached to a surface of a substrate.

FIG. 8 illustrates a view of an IC die and conductive elements formed on a surface of a substrate.

FIG. 9 illustrates a view of a plurality of solder balls, an IC die, and a first surface of a substrate encapsulated in mold compound.

FIG. 10 illustrates a view of solder balls exposed above a mold top surface.

FIG. 15 illustrates a view of mold compound having holes that expose respective solder balls.

FIGS. 16 and 17 illustrate views of interposer substrates having conductive posts and contact pads, respectively.

FIGS. 18-22 illustrate views of interposer substrates coupled to a substrate.

Figure 1:
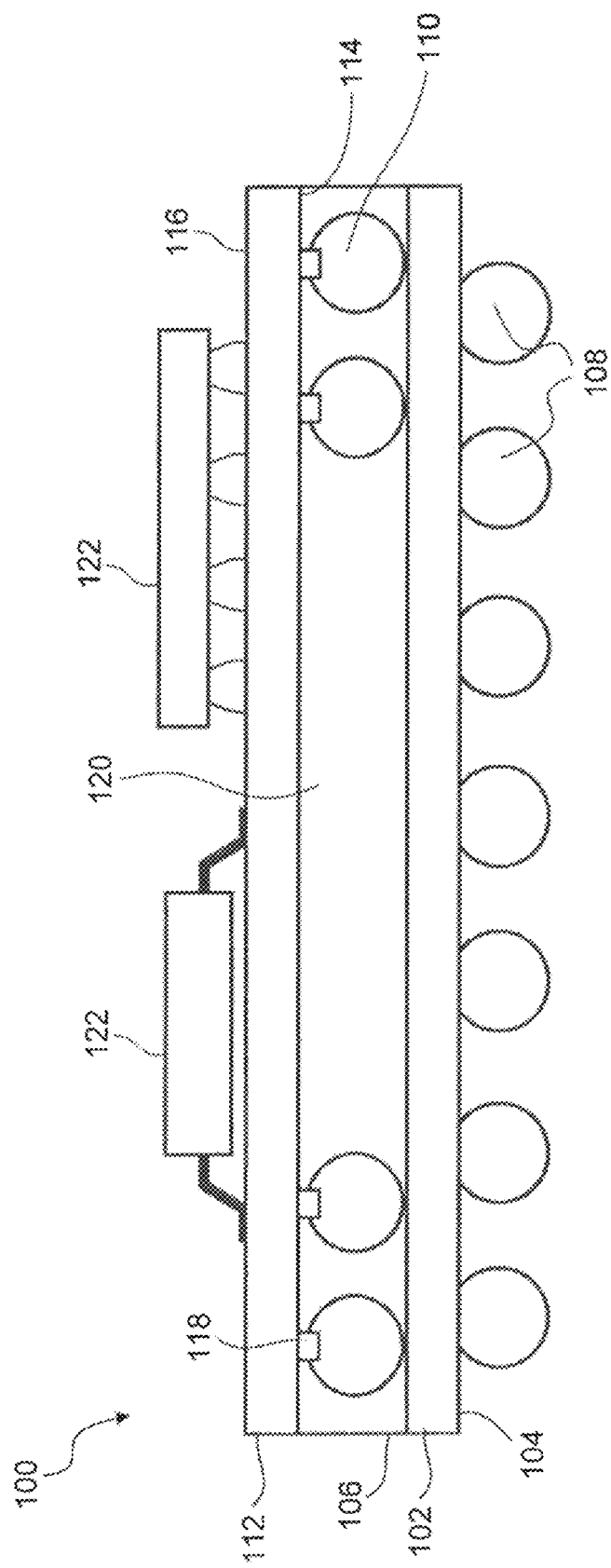
FIG. 1 illustrates a view of a vertical/3-dimensional package interconnection with an interposer substrate.

The present disclosure will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect snub feature, structure, or characteristic in connection with other embodiments whether or not explicitly described.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

The embodiments described herein provide a methodology for package vertical interconnection interconnections through an embedded vertical interconnection structure within an IC package. The package vertical interconnection structure is a molded ball grid array or molded conductor posts as disclosed in U.S. patent application Ser. No. 11/589,120, filed Oct. 30, 2006 by Zhao and Khan, and commonly assigned with the present disclosure; the disclosure of the '120 application is incorporated herein by reference in its entirety, as though set forth in full below. The molded vertical interconnect elements are partially exposed through the top surface of the package mold compound, forming contact pads on the package top. The contact pads for interconnection provide landing pads for electrical interconnection on top of the mold compound. A printed circuit hoard, called an interposer substrate herein, is connected to the contact pads on the package mold top. The interposer substrate has one or more conductor posts or solder bumps or balls on its bottom as interconnect terminals. The through the mold compound interconnection structure of the bottom package provides direct interconnection between the package bottom substrate and the interposer substrate on the package mold top. The interposer substrate provides an interface structure for package-to-package vertical interconnection. The interposer substrate top has contact pads for interconnection with other surface mountable components such as ASICs and memory device packages including flip chip and wire bond BGAs, passive components such as capacitors, inductors, electromagnetic coupling balms, electromagnetic radiators, resistors, etc.

The disclosure is related to (1) a system in package (SiP) technology, (2) a package-on-package (PoP) vertical interconnection technology of two or more ball grid array (BGA) packages. (3) a low profile package PoP design, (4) enabling stacking of chip-scale packages, (5) reduction of electromagnetic interference (EMI) and providing EMI shielding, (6) thermal performance enhancement technologies for IC packages, (7) electrical performance enhancement technologies for IC packages, and (6) high speed communication applications.

One or more integrated circuit (IC) dies may be attached directly to the top surface of the printed circuit substrate using epoxy. Wire bonds can be used to electrically connect an IC die to the printed circuit on the substrate. A matrix of solder balls is mounted on the bottom side of the substrate.

The IC die and the wire bonds are protected from the environment by a plastic molding compound which encapsulates both the IC die and the wire bonds and covers the center region on the top surface of the substrate. The periphery of the substrate top surface can be exposed.

Conventional IC die encapsulation processes such as dam-and-fill (glob top), mold cap injection molding (transfer molding), strip or panel over-molding (mold compound covers the edges of package substrate) can be used in the proposed designs for both top and bottom packages. The interconnection structure can be used for wire bond ball grid array (BGA) packages, such as fine pitch BGA (FBGA) and plastic BGA (PBGA), and flip chip packages. The disclosed structure can also be used for package stacking of land grid may (LGA) packages, leadframe and flip chip packages stacking on BGA package, and their combinations.

Stacking of packages on top of one another requires electrical interconnections between the external terminals of the top and bottom packages. Overmolded area array packages such as FBGA and LGA packages do not have electrical signal interconnect terminals on the package top surface. The same problem exists for certain type of leadframe packages such as no-lead quad flat package (QFN, also known as MLP, MLF, and LPCC packages) as well as thin array plastic package (TAPP) (see, e.g., U.S. Pat. No. 7,482,690, issued Jan. 27, 2009, titled "Electronic Components Such As Thin Array Plastic Packages And Process For Fabricating Same." Consequently, these packages cannot have other packages stacked on their top.

A solution using truncated solder balls molded within the package molding compound and extended to the top of the mold on the package top provides electrical contact pads on the mold top with other packages. Because the solder balls can be embedded within the mold of the bottom package, the package-to-package interconnect contact pads do not have to be placed outside the mold of the bottom package as required in the stacked packages. Therefore, the footprint of the stacked packages can be minimized. In mobile applications such as cell phones, hand-held video and audio players, smaller footprint size of system in package (SiP) usually translates into smaller application devices. Conductor posts through the package mold can also be used for the bottom package contact pads with top mounted component.

However, contact pads provided directly on the bottom package mold top have the drawback of a large variation of pad diameter, pad placement location accuracy, and pad-to-pad pitch. These problems made it difficult to mount components requiring a high precision of interconnect contact pads on the bottom package. For example, fine pitch components with electrical contact pitch smaller than 0.40 mm may be difficult to mount on top of the bottom package mold due to high yield loss caused by short or open at the electrical contact terminals. A solution to this problem is to use an interposer substrate between the bottom package and top mounted components. The interposer substrate can have interconnect terminals or pads on its bottom with size and terminal-to-terminal pitches suitable for the interconnection with the contact pads on the bottom package mold top. The interposer substrate also has electrical interconnect contact pads on its top for receiving surface mountable components such as IC packages and passive components. Interconnect terminal pitches are typical larger on the interposer substrate bottom than the pitches of contact pads on the interposer substrate top to accommodate lower manufacturing control tolerance for contact pads on the bottom package. From an interconnect pitch standpoint the interposer substrate acts as a transition from a larger interconnect pitch on the bottom to a smaller interconnect pitch on the top. It is also possible to have a smaller interconnect terminal pitch on the interposer substrate bottom and a larger interconnect terminal pitch on top. The same interconnect terminal pitches on both sides of the interconnect substrate are also possible with the interposer substrate. In essence, the interposer substrate is an interconnect structure that facilitates vertical interconnection between packaged components.

Because the solder balls are placed directly on the contact pads of the bottom die, the electrical interconnection path length from the IC die in the bottom package to the IC die in the top package is substantially reduced. Consequently, the impedance of the interconnection can be reduced substantially and higher speeds for signal transmission between the IC dies can be realized.

Disclosed herein are structures and implementations of package-to-package direct interconnection structure embedded within a plastic mold compound and exposed on the plastic mold top surface. Applications of the interconnection contact pads on molded IC chips for package stacking and various structures of stacked packages are also disclosed herein.

FIG. 1 illustrates a view of the structure of a vertically integrated IC package 100. IC package 100 has a first or bottom package substrate 102. First substrate 102 had a first or bottom surface 104 and a second or top surface 106. Solder balls 108 are fixed to first surface 104 in physical and electrical contact with second surface 106. Solder balls 108 are attached to pads (not shown) on first surface 106 of first package substrate 102. Solder balls 110 are attached to pads (not shown) on second surface 106 of substrate 102.

IC package 100 further includes a second or interposer substrate 112 which is spaced from first substrate 102. Interposer substrate 112 has a first or bottom surface 114 and a second or top surface 116. One or more, typically a plurality, of conductor posts or pillars 118 are physically and electrically connected to first surface 114 of interposer substrate 112. Conductor posts 118 physically and electrically mate with corresponding contact pads (not shown) on first substrate 102 via solder balls 110. In another embodiment, one or more of conductor posts 118 can be replaced with small solder balls or other types of interconnection elements, as would be appreciated by those skilled in the art based on the description herein. Conductor posts 118 can be formed out of copper, aluminum, or other materials used to form conductive interconnection elements, as would be appreciated by those skilled in the relevant art based on the description herein. A mold compound 120 is interposed between first and second substrates 102 and 112.

Solder balls 110 may be molded within molding compound 120, as disclosed in U.S. Pat. No. 7,714,453, issued May 11, 2010, titled "Interconnect Structure And Formation For Package Stacking Of Molded Plastic Area Array Package," and commonly assigned with the present disclosure. The disclosure of the '453 patent is incorporated herein by reference in its entirety as though set forth in fall below.

As described in more detail below, after molding and post mold curing, solder balls 110 may be entirely encapsulated in the molding compound 120. The top of the solder balls could also be partially exposed if the solder ball height is at or very close to the thickness of the mold cap. A top layer of molding compound 120 is subsequently removed and, in the process, the top of solder balls 110 are truncated simultaneously to expose the circular pads formed by the truncated solder spheres that are embedded in mold compound 120. Other methods, such as mechanical drilling, chemical etching, etc., as disclosed in the '120 patent, can also be used to expose solder balls 110. In addition, laser ablation can also be used to remove mold compound 120 and expose solder balls 110 to make interconnect contact pads on bottom package top surface 106. These exposed circular pads provide contact terminals on the mold top.

The second or top surface 116 of interposer substrate has one or more, typically a plurality, of contact pads (not shown) on its surface. These contact pads can be used to connect electronic components 122 for package-to-package electrical interconnections such as package stacking to form a package-on-package (PoP) stack. Multiple electronic components, including packaged IC devices, inductors, capacitors, and resistors can all be attached to the package mold top on these exposed pads.

There are various methods to make contact pads on the bottom package mold to surface 106 through exposing the top of the molded solder balls 110. Examples of implementation by removing a layer of package mold top and to truncate and expose the embedded solder balls are illustrated in the 120 application. An advantage of removing an entire layer of package mold compound 120 is that the contact pads formed are on the same surface as the top surface of mold compound 120. Conductor posts 118 can be used as the terminals to contact bottom package substrate 102 through interconnect solder balls 110. Manufacturing tolerances for both the bottom package warpage and interposer substrate 112 can also be increased and still allow the interconnection contact when the contact pads are on the top plane of the bottom package. When the bottom package mold top contact pads are below the top plane of mold compound 120, longer contact terminals on interposer substrate 112 are required in order to reach the contact pads. Less warpage tolerances for both bottom package and interposer substrate 112 are allowed to ensure contact between the interposer substrate terminals and the contact pads below the bottom package mold top surface.

Different types of device packages (flip chip, FBGA, etc.) can be mounted on the interposer substrate top surface 116. More than one package can be mounted on the interposer substrate. Antenna(s), antenna array(s)/matri(ces), baluns for wireless applications, and passive components such as capacitors, inductors, and resistors can be mounted on interposer substrate 112.

A gap (standoff) between interposer substrate 112 and first substrate 102 the top surface of mold compound 120 is allowed but not preferred. Contaminants can be trapped in this gap. These contaminants could cause shorting between adjacent contact pads on the mold top or between adjacent conductor posts 118.

An air gap between interposer substrate bottom surface 114 and the top surface of mold compound 120 can be filled with adhesive material preformed on bottom surface 114 of interposer substrate 112. For example, a layer of heat activated adhesive cart be formed (coated or laminated) on bottom surface 114 of the interposer substrate 112. During the manufacturing process of the interposer substrate-to-bottom package attachment, the adhesive layer is bonded to the bottom package mold top and fills the gap between interposer substrate 112 and the top surface of mold compound 120. Examples of a suitable adhesive film can be the Tomoegawa X adhesive or the Toray 8300 adhesive.

Interposer substrate 112 can be either stiff or flexible and can have either single conductor layer or multiple conductor layers. The conductor pillars 118 on the bottom surface 114 of the interposer substrate can be made of copper. Conductive posts 118 are exposed. A method of making copper pillars on a substrate is shown in published international application WO2006/028090, published Mar. 16, 2006, and titled "Member for Interconnecting Wiring Films and Method for Producing the Same."

FIGS. 2A-2D illustrate views of various embodiments of elements used to couple interposer substrate 112 to first substrate 102. To enhance surface wetting during interposer substrate attachment to the bottom package contact pads, the tip of conductor posts 118 (see FIG. 2A) on bottom surface 114 can be plated with a layer 202 of solder, tin, tin and silver alloy, or other metal of non-metal materials (see FIG. 2B). Layer 202 can help to reduce oxidation and promote fusion between the conductor posts 118 on interposer substrate 112 and the contact pads on the bottom package mold top. A solder cap 204 (see FIG. 2(c)) can also be formed on the tip of conductor posts 118, to promote fusion of the conductor posts 118 and the contact pads on bottom package mold top surface.

Small solder balls 206 (see FIG. 2D) or solder bumps can be attached directly on the bottom of the interposer substrate 112 to replace the copper pillars 118. An interposer substrate 112 with solder bumps/balls 206 attached on bottom surface 114 is called a bumped substrate herein. The solder balls 206 can be attached to the interposer substrate bottom surface 114 using the same process as solder ball attachment to a ball grid array (BGA) package.

In the first step, a transfer pin applies solder flux onto substrate contact pads. The solder balls are then picked and place on the substrate. Finally reflow for ball-to-substrate attachment.

Small solder balls 206 can be the same or a different material as solder balls 110. For example, Pb-free solder balls (Tin/silver/copper, tin/silver, etc.) can be used for both solder balk 206 and solder balls 110.

A flexible substrate, such as Upilex-S polyimide tape substrate or a stiff substrate such as BT core with weaved glass fiber cloth substrate, can be used as the interposer substrate 112. Both organic materials and inorganic materials such BT, FR4, ceramic, glass, silicon can be used. Examples include a laminated BT substrate, an Ajinomoto Film (ABF) build-up flip chip (FC) substrate, and a through silicon via interposer.

An advantage of using solder balls 206 for the interconnect terminals of interposer substrate 112 is that the conventional solder ball or solder bump attachment method can be used in the ball-to-substrate attachment manufacturing process. On the other hand manufacturing throughput of a bumped interposer substrate can be substantially higher than when conductor posts 118 are used due to a reduced number of processing steps. For example, photo imaging, photo masking and plating or chemical etching processes required for making a conductor posts 118 are not needed in a bumped substrate manufacturing processes. Moreover, the processing cost of attaching solder balls 206 to interposer substrate 112 is much lower than for attaching conductor posts 118.

Another important advantage of solder bumped substrate technology is that the height of the interconnect terminals can be two times higher or more than that of conductor posts 118. For example, a typical height of conductor posts 118 is approximately 25-45 µm in today's conductor post substrate technology shown by WO 2006/028090, published Mar. 16, 2006, entitled "Member for Interconnecting Wiring Films and Method for Producing the Same," to Lijima et al., which is incorporated herein by reference in its entirety as though set forth in full below. In a solder ball attached interposer substrate, a solder ball height of 100 µm or more can be made using a conventional low cost manufacturing process.

An advantage of the package construction illustrated in FIG. 1 is that the vertical interconnection length between the bottom substrate 102 and components 122 is substantially shorter than the interconnection through a PCB. Since the interposer 112 has the shortest distance to the bottom substrate 102, the interposer substrate 112 provides a low-impedance signal transmission path to the bottom package. This interconnection path enables high speed communication between an IC die located in the bottom package (not shown in FIG. 1) and components 122 mounted on interposer substrate 112. The package construction in FIG. 1 provides a bottom substrate-to-top substrate high speed communication bus through the molded solder balls. Consequently, high speed communication between the bottom package and components 122 can be achieved.

As shown in FIG. 1, more than one component 122 can be mounted on interposer substrate 112. Different types of packages (flip chip, FBGA, etc.) can be mounted on the interposer substrate.

FIGS. 3A and 3B illustrate views of variations in the manner in which conductor posts 118 can be attached to solder balls 110. In FIG. 3A, a mold compound 320a is truncated so that tops 308 of solder balls 110a are flush with the top surface of mold compound 320a. The mold compound 320a can be sufficiently truncated such that the tops of solder balls 110a are also removed to thereby form a circular solder pad flush with the top surface of mold compound 320a. In a second embodiment shown in FIG. 3B, the top surface of mold compound 320b is above the tops of solder balls 110. The top surface of mold compound 320b is drilled or etched in the regions above solder balls 110 to form openings 302 so that conductor posts 118 of interposer substrate 112 will be received in openings 302 and make contact with solder balls 110.

The interposer substrate shown in FIGS. 1-3 has the same size as the bottom package. An interposer substrate with a size smaller than the bottom package can also be used. Additionally, more than one interposer substrate can be attached to the bottom package using the same method and steps discussed above.

FIG. 4A illustrates a view of a molded SiP (system in package) packaging construction. Both top 114 and bottom 116 surfaces (not numerically referenced in FIG. 4A) of interposer substrate 112 have direct electrical interconnection with first substrate 102 of the bottom package. On bottom surface 114 of interposer substrate 112, conductor posts 118 connect with first substrate 102 through the solder balls 110 in the bottom substrate package 102 at the contact pads on bottom substrate package top 106. On the top surface 116 of the interposer substrate, a wire bond 402 connects interposer substrate 112 with first substrate 102 along the exposed periphery of bottom package substrate 102. A second mold compound 406a provides protection for the wire bond 402.

The following manufacturing steps can be used to make a SiP package shown in FIG. 4A. The interposer substrate is attached to bottom package first mold compound. The component(s) is mounted to the interposer substrate top. A wire bond connection between the interposer substrate and bottom package SiP. Finally, encapsulate the bond wires and component(s) on the interposer substrate with a second mold compound.

Alternatively, the sequence of the above assembly processes of attaching the interposer substrate to bottom package first mold compound and mounting the component(s) to the interposer substrate top can be exchanged by mounting components on the interposer substrate before the interposer substrate is attached to the bottom package mold top.

In a second mold process, bottom surface 116 of interposer substrate 112 can be partially exposed in the center (see FIG. 4B). Components 122 can be mounted to the interposer substrate top after second mold compound 406b is used to encapsulate the wire bonds 402.

The following manufacturing steps can be used to make a SiP package shown in FIG. 4B. Attach an interposer substrate to a bottom package first mold compound. Then make a wire bond connection between the interposer substrate and bottom package substrate. Encapsulate the wire bonds and component(s) on the interposer substrate with a second mold compound. Finally mount the component(s) to the interposer substrate top.

Interposer substrate 412c can have substantially the same size as first substrate 102 (see FIG. 4C). In this configuration, interposer substrate 112 top surface 416c is not wire bonded to the bottom package.

Figure 5C:
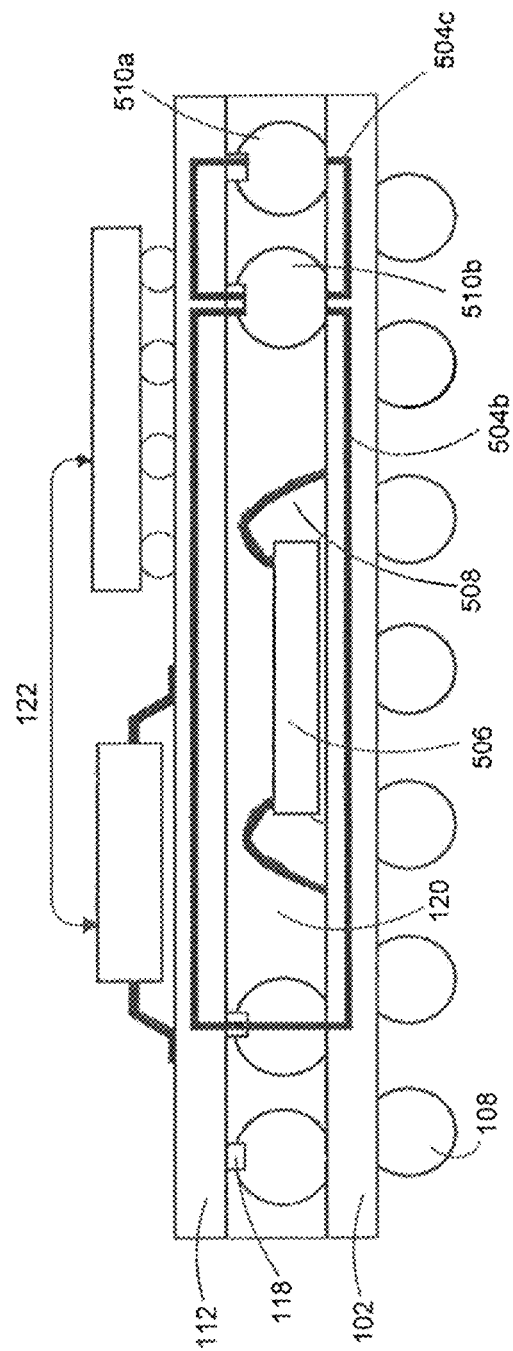
FIG. 5C illustrates a view of an embodiment having EMI shield and system partitioning with signal partitioning.

FIG. 5A shows a closed 3-dimensional electrical potential surface formed by connecting the ground or power planes in both first substrate 102 and interposer substrate 112. The interconnection of the substrate planes separated by mold compound 120 is accomplished with an array of solder balls 510. Solder balls 510 can be substantially similar to solder balls 110. The IC die (or dies) of the bottom package 102 is enclosed within a 3-dimensional electrical potential enclosure 504a comprising substrates 102 and 112 and grounded solder balls 510. This structure provides EMI emission protection by shielding electromagnetic radiation from as well as towards an IC die 506 inside the bottom package. For RF signal interconnection between the top and bottom packages, RF signal traces on the substrates at the top (interposer substrate 112) and the bottom (first 102) can be routed within the electrical potential enclosure to confine EMI emission within the enclosure. The 3-dimensional electrical potential enclosure is preferably maintained at ground or power potential. In other words, ground or power planes in the top and bottom substrates are preferred for the construction of the EMI shield enclosure. In addition, connecting the bottom package ground or power plane with solder balls 510 and the planes of interposer substrate 112 can improve heat spreading from the bottom package IC die and improve the thermal performance of the SiP 3D packaging structure. In addition to FIG. 5A, the 3D SiP interconnection design can be partitioned in various manners to separate digital from analog as well as various RF signals. For example, FIG. 5B shows that inner row(s) of molded small solder balls 510b can be used to construct the 3-dimensional electrical ground potential enclosure within the SiP. Multiple electrical potential enclosures 504b and 504c can be constructed as shown in FIG. 5C.

Figure 24:
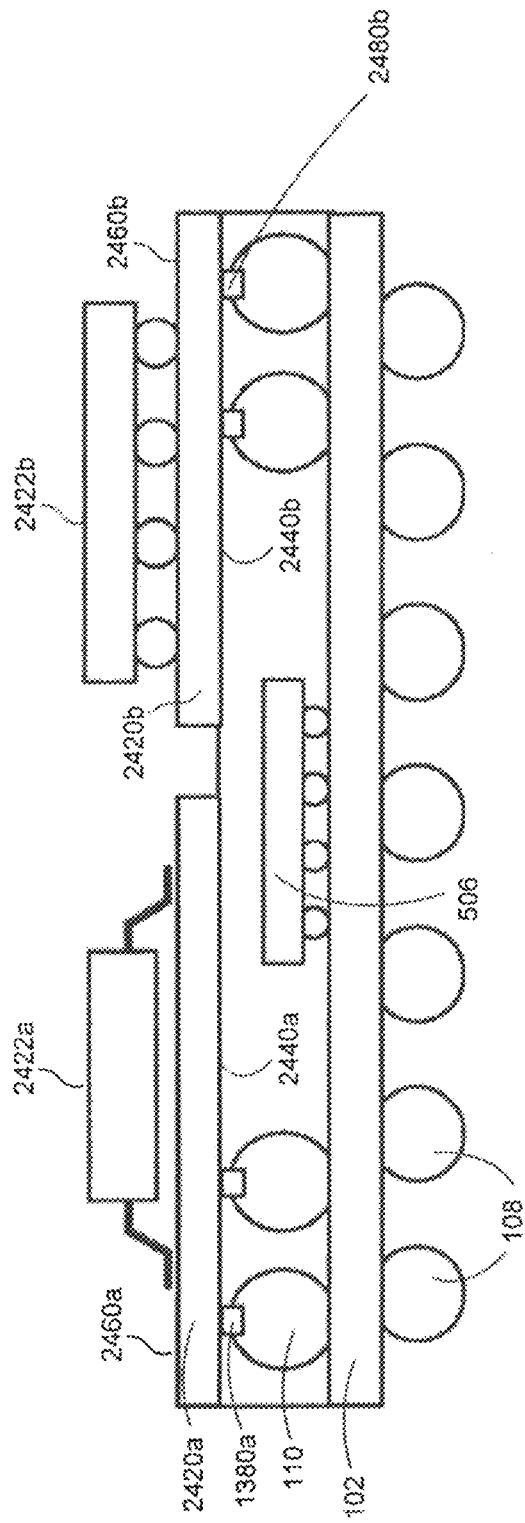
FIG. 24 illustrates a view of a package interconnection embodiment with multiple interposer substrates.

FIG. 24 shows a further embodiment of an IC structure having multiple interposer substrates. More particularly, FIG. 24 shows at least two interposer substrates 2420a and 2420b. Each interposer substrate has a first or bottom surface 2440a and 2440b, respectively, and a second or top surface 2460a and 2460b, respectively. Similar to the single interposer substrate embodiments, each interposer substrate 2420a and 2420b has contact posts or pillars 2480a and 2480b, respectively, which make physical and electrical contact with solder balls or bumps 110 on bottom substrate 102. Various types of circuit components may be mounted on the multiple interposer substrates using wire bonding techniques (as shown for circuit component 2422a) or solder post bonding techniques (as shown for circuit component 2422b), or any other suitable mounting and connection technique. It will be apparent to anyone skilled in the relevant art that any number of interposer substrates may be mounted on the first substrate member. Further any number and type of circuit components (e.g., leadframe and BGA packages) may be mounted to each interposer substrate, depending on the needs of the circuit designers.

Figure 6:
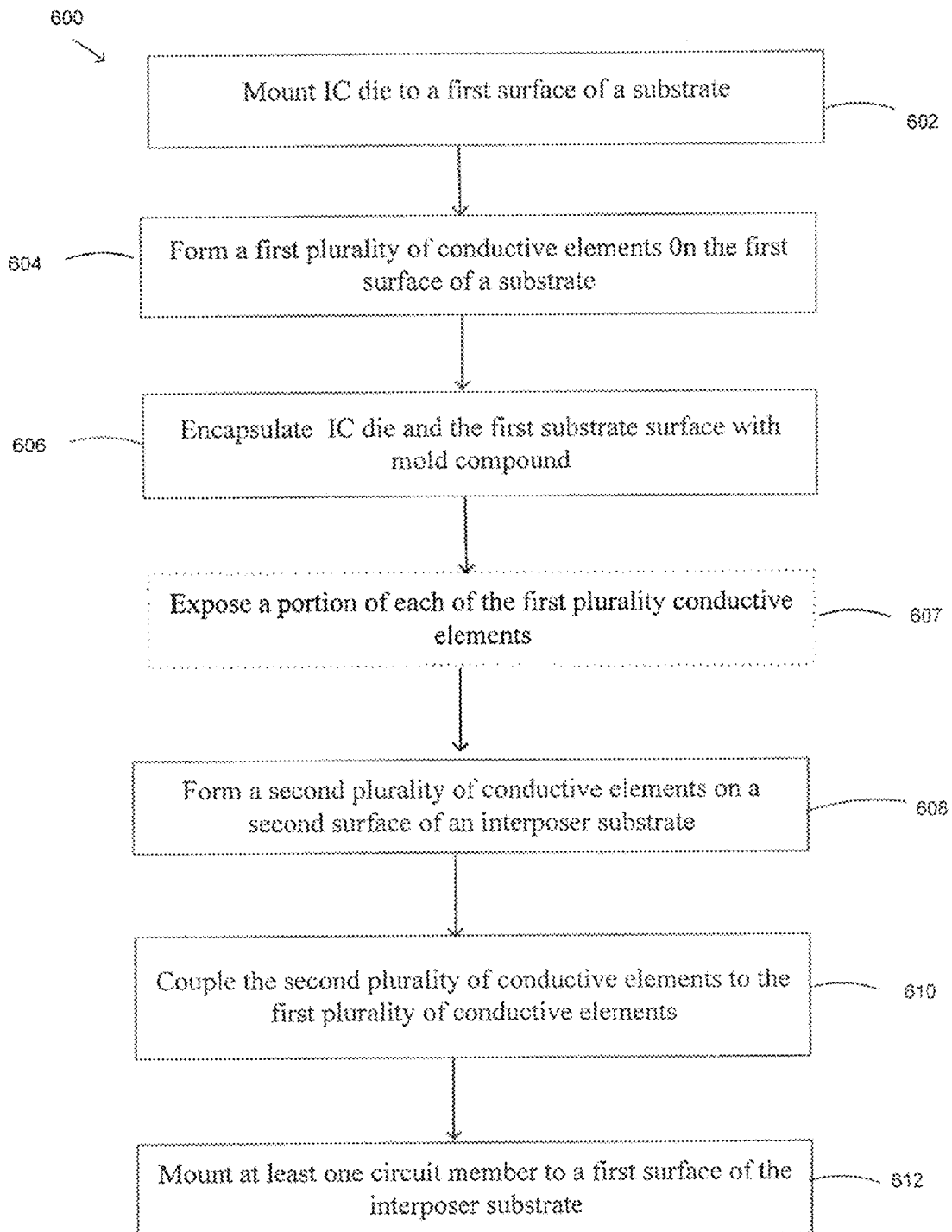
FIG. 6 illustrates an example flowchart for manufacturing IC packages, according to exemplary embodiments of the present disclosure.

FIG. 6 shows a flowchart 600 providing example steps for assembling an IC package. Other structural and operational embodiments will be apparent to persons skilled in the relevant art(s) based on the following discussion. The steps shown in FIG. 6 do not necessarily have to occur in the order shown. The steps of FIG. 6 are described in detail below.

In step 602, an IC die is mounted to a first surface of a substrate. For example, in FIG. 7, an IC die 702 is coupled to a first surface 704 of a substrate 706 using solder bumps 708.

In step 604, a first plurality of conductive elements is farmed on the first surface of the substrate. For example, in FIG. 8, solder balls 802 are formed on first surface 704 of substrate 706.

In step 606, at least the IC die and the first surface of the substrate are encapsulated with an mold compound. For example, in FIG. 9, solder balls 802, IC die 702, and first surface 704 of substrate 706 are encapsulated in a mold compound 902. As shown in FIG. 9, solder balls 802 are completely encapsulated in mold compound 902. In another embodiment, however, portions of solder balls 802 may be exposed. For example, in the embodiment of FIG. 10, the tops of solder balls 802 are left exposed by mold compound 902.

Figure 11:
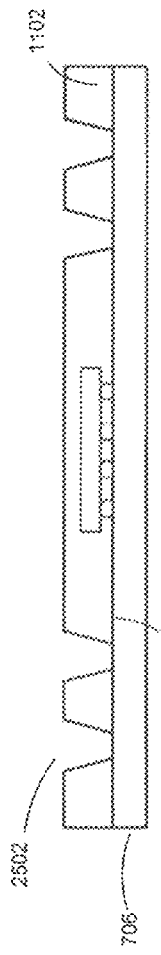
FIGS. 11-12 illustrate steps in forming through mold vias (TMV) using solder paste.
Figure 12:
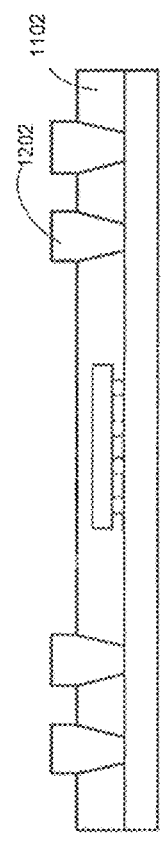

As described above, the steps of flowchart 600 do not have to be completed in the order shown in FIG. 6. For example, in one embodiment, step 606 can be completed before step 604. For example, in FIG. 11, first surface 704 and IC die 702 can be encapsulated in a mold compound 1102. As shown in FIG. 11, via holes 1104 can formed mold compound 1102. In one embodiment, via holes 1104 can be formed in mold compound 1102 through a molding process where the mold chase is designed to have posts at the via holes locations preventing the molding compound from covering the certain regions (e.g., contact pads) on surface 704 of substrate 706. Alternatively, via holes 1104 can be formed after mold encapsulation by drilling through mold compound 1102 using a process such as laser drill or chemical etching. A first plurality of contact members can then be formed by filling the via holes with conductive material. For example, in FIG. 12, solder paste 1202 fills via holes 1104 (not numerically referenced in FIG. 12) to create a first plurality of conductive elements.

Figure 13:
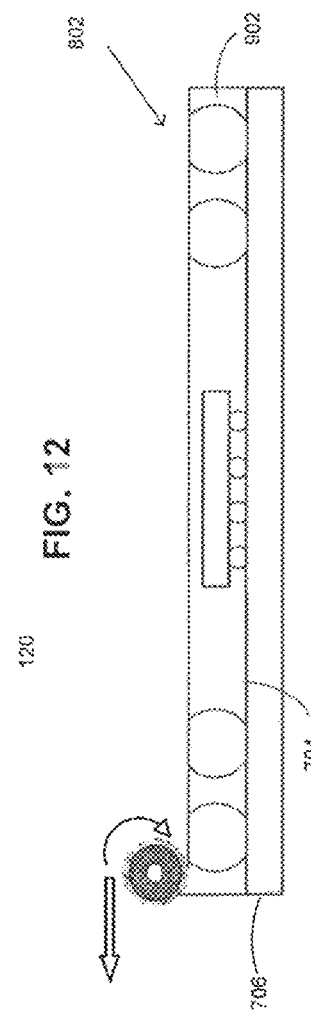
FIGS. 13 and 14 illustrate views of devices after removal of layers of a mold compound.

In step 607, a portion of each of the first plurality of conductive elements is exposed. For example, in FIG. 13, the tops of solder balls 802 are exposed and truncated by removing a layer of mold compound 902. As shown in FIG. 13, truncated solder balls 802 form contact pads on the same plane of the remaining mold compound top surface.

In another embodiment, portions of solder balls 802 can be exposed by drilling through the mold compound. For example, in FIG. 15, holes 1502 are drilled into mold compound 902 to expose top portions of solder balls 802. Methods to drill through mold include such as mechanical drilling and chemical etching. Other drilling methods including laser ablation of the mold compound known in this field of art can also be used.

Figure 14:
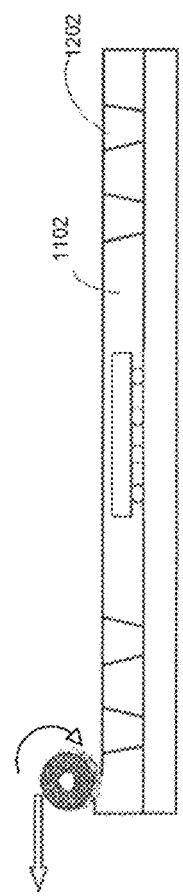

In an embodiment, step 607 can be optional. For example, in embodiments in which the encapsulation in step 606 is executed such that portions of the first plurality of conductive elements remain exposed, step 607 can be omitted. In another embodiment, a portion of the mold compound can be removed even when portions of the first plurality of conductive elements are exposed. For example, in the embodiment of FIG. 14, the tops of solder paste 1202 can be truncated by removing a layer of mold compound 1102. In doing so, a level surface is created on the top surface of mold compound. In alternate embodiments, a flat surface can be created by flattening the tops surfaces of the first plurality of conductive elements through, e.g., ball, post, or bump coning processes.

In step 608, a second plurality of conductive elements are on is second surface of an interposer substrate. In an embodiment, the second plurality of conductive elements can be a plurality of conductive posts. For example, in FIG. 16, conductive posts 1602 are formed on a surface 1604 of interposer substrate 1606. In another embodiment, the plurality of conductive elements can be a plurality of contact pads. For example, in FIG. 17, contact pads 1702 are formed on surface 1604 of interposer substrate 1606. Contact pads 1702 are substantially flush with surface 1604 of interposer substrate 1606.

In step 610, the first plurality of conductive elements are coupled to the second plurality of conductive elements. For example, in FIG. 18, conductive posts 1602 are coupled to solder balls 802. In doing so, electrical interconnection between interposer substrate 1606 and substrate 706 is established. As shown in FIG. 18, interposer substrate 1606 is placed on a flat surface formed by mold compound 902 and solder balls 802. In another embodiment, as described above, solder balk 802 can be exposed by drilling holes in the mold compound, thus, in the example of FIG. 19, conductive posts 1602 can be coupled respective ones of solder balls 802 through the holes formed in mold compound 902. In yet another embodiment, an adhesive can be used to facilitate the coupling process. For example, in FIG. 20, an adhesive layer 2002 (e.g., heat-activated adhesive) can be applied to surface 1604 to facilitate coupling between interposer substrate 1606 and the top surface of mold compound 902.

Figure 21:
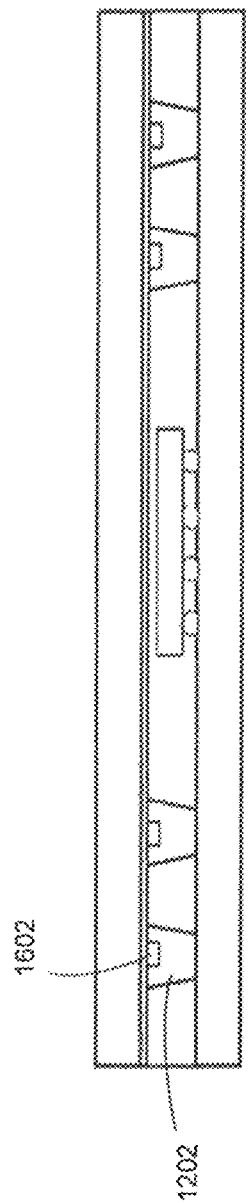

Moreover, as described above, solder paste filled into via holes can be used instead of solder balls for the first plurality of conductive elements. Thus, in the example of FIG. 21, conductive posts 1602 can be coupled to solder paste 1202, e.g., through a reflow process.

Figure 22:
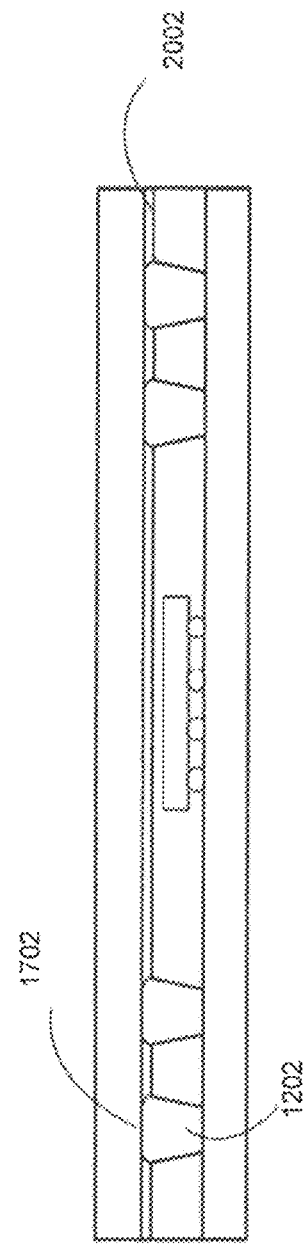

In another embodiment, as described above, contact pads can be used instead of conductive posts for the second plurality of conductive elements. Thus, in the example of FIG. 22, solder paste 1202 is coupled to contact pads 1702.

Figure 23:
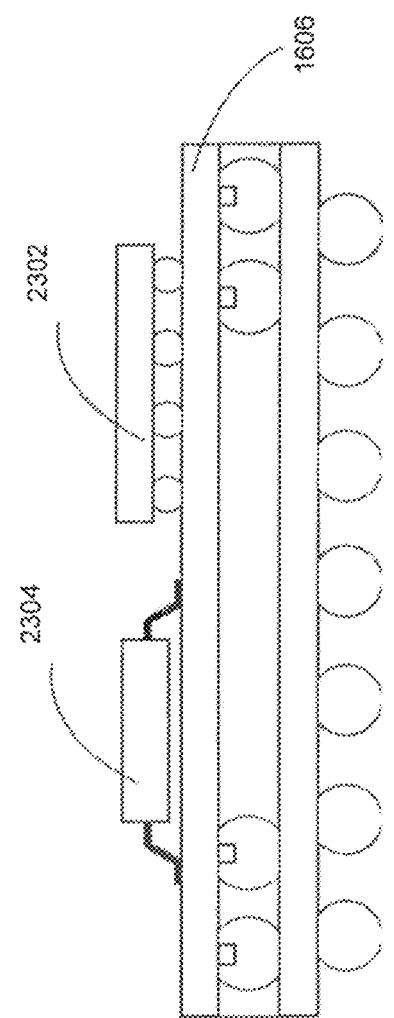
FIG. 23 illustrates a view of a component attached on a surface of an interposer substrate.

In step 612, at least one circuit member is mounted on a first surface of the interposer substrate. For example, passive components such as capacitors, inductors, electromagnetic coupling baluns, electromagnetic radiators, antennas, resistors, etc. can also be mounted on the first surface of the interposer substrate. For example, in FIG. 23, first and second circuit members 2302 and 2304 are coupled to surface 2306 of interposer substrate 1606.

Note that step 612 can be performed before step 610 where components or packages can be mounted onto the interposer substrate before the assembly is attached to the bottom package mold top. For example, passive components such as capacitors, inductors, electromagnetic coupling baluns, electromagnetic radiators, antennas, resistors, etc. can also be mounted on the top of interposer substrate 112.

CONCLUSION

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents.

What is claimed is:

1. A method of manufacturing an integrated circuit (IC) package, comprising:
    mounting a first plurality of contact members on a surface of a package member;
    encapsulating the first plurality of contact members with a mold compound to form a molding layer;
    forming a plurality of cavities in the mold compound to expose respective surfaces of a first plurality of conductive elements;
    inserting a second plurality of contact members located on a first surface of an interposer substrate into the plurality of cavities such that the second plurality of contact members contact corresponding ones of the first plurality of contact members and such that a surface of the molding layer contacts the first surface of the interposer substrate, wherein the interposer substrate is configured such that a circuit member mounted to a second surface of the interposer substrate is electrically coupled to the first plurality of contact members.

2. The method of claim 1, further comprising:
    mounting an IC die to the surface of the package member, wherein the IC die is electrically coupled to the first plurality of contact members.

3. The method of claim 1, further comprising:
    removing a portion of the mold compound such that a surface of each of the first plurality of contact members is substantially flush with the surface of the molding layer.

4. The method of claim 1, further comprising:
    forming the second plurality of contact members on the first surface of the interposer substrate.

5. The method of claim 1, further comprising:
    mounting the circuit member to the second surface of the interposer substrate.

6. The method of claim 5, wherein the circuit member comprises a ball grid array (BGA) package, and wherein mounting the circuit member comprises:
    mounting the BGA package to the second surface of the interposer substrate.

7. The method of claim 5, wherein the circuit member comprises a leadframe package, and wherein mounting the circuit member comprises:
    mounting the leadframe package to the second surface of the interposer substrate.

8. The method of claim 1, wherein the second plurality of contact members comprise conductive posts extending from the first surface of the interposer substrate to make contact with respective ones of the first plurality of contact members.

9. The method of claim 1, wherein the inserting further comprises:
    inserting the second plurality of contact members into the plurality of cavities such that a Faraday cage is formed when an outer periphery of the second plurality of contact members is coupled to corresponding ones of the first plurality of contact members.

10. The method of claim 1, wherein mounting comprises:
    mounting a plurality of solder balls on the surface of the package member.

11. The method of claim 1, wherein the second plurality of contact members comprises a plurality of solder balls, and wherein the method further comprises:
    coupling the plurality of solder balls to corresponding ones of the first plurality of contact members.

12. The method of claim 1, wherein the interposer substrate comprises a plurality of conductor layers.

13. The method of claim 1, further comprising:
    forming the package member.

14. The method of claim 13, wherein forming comprises:
    forming a trace that is configured to shield radiation.

15. The method of claim 1, further comprising:
    encapsulating at least a portion of the surface of the package member and at least a portion of the second surface of the interposer substrate.

16. The method of claim 15, wherein the encapsulating at least the portion of the surface of the package member further comprises:
    encapsulating all of the second surface of the interposer substrate.

17. The method of claim 1, further comprising:
    mounting the circuit member and a second circuit member to the second surface of the interposer substrate.

18. A method of manufacturing an integrated circuit (IC) package, comprising:
    mounting a first plurality of contact members on a surface of a package member;
    encapsulating the first plurality of contact members with a mold compound to form a molding layer;
    forming a plurality of cavities in the mold compound to expose respective surfaces of a first plurality of conductive elements; and
    inserting a second plurality of contact members located on a surface of an interposer substrate into the plurality of cavities such that the second plurality of contact members contact the first plurality of contact members and such that a surface of the molding layer is flush with the surface of the interposer substrate.

19. The method of claim 18, further comprising:
    removing a portion of the mold compound such that a surface of the first plurality of contact members is substantially flush with the surface of the molding layer.

20. The method of claim 18, wherein the second plurality of contact members comprise conductive posts extending from the surface of the interposer substrate to make contact with the first plurality of contact members.

* * * * *